(12) United States Patent
Okuda et al.

(10) Patent No.: US 6,479,923 B1
(45) Date of Patent: Nov. 12, 2002

(54) PIEZOELECTRIC CERAMIC, METHOD FOR PRODUCING PIEZOELECTRIC CERAMIC, AND PIEZOELECTRIC OSCILLATOR

(75) Inventors: Akihito Okuda, Hikone; Akinobu Takamura, Yokaichi; Masataka Kida, Omihachiman; Yoshiaki Kohno, Moriyama, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/321,243

(22) Filed: May 27, 1999

(30) Foreign Application Priority Data

May 29, 1998 (JP) .......................................... 10-149838

(51) Int. Cl.[7] ............................................. H01L 41/187
(52) U.S. Cl. ..................................................... 310/358
(58) Field of Search ........................ 310/358; 501/134, 501/136

(56) References Cited

U.S. PATENT DOCUMENTS

| 5,320,910 A | 6/1994 | Banno et al. | 428/546 |
|---|---|---|---|
| 5,444,326 A | * 8/1995 | Yoshida | 310/359 |
| 5,835,841 A | * 11/1998 | Yamada et al. | 428/546 |
| 6,228,481 B1 | * 5/2001 | Yamada et al. | 428/328 |
| 6,245,439 B1 | * 6/2001 | Yamada et al. | 428/546 |

FOREIGN PATENT DOCUMENTS

| JP | 56-73666 | * 6/1981 | 310/358 |
|---|---|---|---|
| JP | 56-78424 | * 6/1981 | 310/358 |
| JP | 63-60110 | 3/1988 | C01G/23/00 |
| JP | 2-167893 | * 6/1990 | 310/358 |
| JP | 8-133827 | 5/1996 | |
| JP | 8-133828 | 5/1996 | |
| JP | 10-279350 | 10/1998 | |

OTHER PUBLICATIONS

Japanese Examination Report issued Apr. 9, 2002.

* cited by examiner

Primary Examiner—Thomas M. Dougherty
(74) Attorney, Agent, or Firm—Dickstein, Shapiro, Morin & Oshinsky, LLP.

(57) ABSTRACT

A piezoelectric ceramic comprising lead titanate as a primary component, wherein the primary component contains a titanium oxide crystalline phase. Methods for producing the ceramic, and piezoelectric oscillators making use of the ceramic are also disclosed.

4 Claims, 2 Drawing Sheets

PIEZOELECTRIC CERAMIC, METHOD FOR PRODUCING PIEZOELECTRIC CERAMIC, AND PIEZOELECTRIC OSCILLATOR

BACKGROUND OF THE INVENTION

1. Field of the Invention

The present invention relates to a piezoelectric ceramic, and more particularly to a piezoelectric ceramic which is useful in a high frequency range of 10 MHz or more. The invention also relates to a piezoelectric oscillator using the piezoelectric ceramic and to a method for producing the piezoelectric ceramic.

2. Background Art

A piezoelectric ceramic including lead titanate as a main component has been often employed for a piezoelectric oscillator which has a vibration frequency of 10 MHz or more.

In such type of oscillator, the third order vibration mode of longitudinal vibration in the oscillator is utilized. The use of this mode is preferable especially in the high frequency region to achieve good response to an input signal. A method for enhancing the response of third order vibration of a piezoelectric ceramic in which pores of the ceramic are reduced so as to densify the ceramic is known. However, in addition to improving the response of third order vibration, densification of a piezoelectric ceramic also enhances the response of fifth order vibration, which is unnecessary when a third order vibration mode is used. Thus, such a piezoelectric oscillator generating fifth order vibration needs improvements in its characteristics.

There is a method for suppressing the response of fifth order vibration by forming pores dispersed in a piezoelectric ceramic. However, in this case, porosity of the ceramic increases to disadvantageously deteriorate the mechanical strength and reliability of the piezoelectric ceramic.

SUMMARY OF THE INVENTION

In view of the foregoing, the present invention provides a piezoelectric ceramic suppressing the response of fifth order vibration without deteriorating the mechanical strength and reliability thereof. In accordance with another aspect of the present invention, a method for producing the piezoelectric ceramic is provided. Still further, the present invention provides a piezoelectric oscillator using the piezoelectric ceramic.

Accordingly, in a first aspect of the present invention, there is provided a piezoelectric ceramic comprising lead titanate as a primary component, wherein the primary component contains a titanium oxide crystalline phase. By employment of such a constitution, the response of fifth order vibration decreases to thereby suppress unnecessary vibration without deteriorating the mechanical strength and reliability of the piezoelectric ceramic.

Preferably, the grain size of the titanium oxide crystalline phase is about 4 to 28 μm.

In a second aspect of the present invention, there is provided a method for producing a piezoelectric ceramic comprising a step of firing a compact formed of a piezoelectric ceramic predominantly containing lead titanate at about 1230 to 1245° C. By employment of such a temperature range, the response of fifth order vibration can be suppressed without substantial suppression of that of third order vibration.

In a third aspect of the present invention, there is provided a method for producing a piezoelectric ceramic comprising the following steps (1) to (5):

(1) mixing a piezoelectric ceramic material containing lead oxide and titanium oxide to thereby produce a mixture;

(2) firing the mixture to thereby produce a calcined product;

(3) crushing the calcined product and adding titanium oxide powder and a binder to the crushed product to thereby produce a binder-containing mixture;

(4) molding the binder-containing mixture to thereby produce a compact; and (5) firing the compact. By employment of such steps, dispersion of a titanium oxide crystalline phase into lead titanate serving as a primary component is ensured.

In a fourth aspect of the present invention, there is provided a piezoelectric oscillator comprising an insulating substrate, a piezoelectric ceramic element, lead terminals and an outer resin covering for the piezoelectric ceramic element, wherein the insulating substrate has patterned electrodes thereon;

the piezoelectric ceramic element comprises the piezoelectric ceramic and electrodes formed on main surfaces of the ceramic and electrically connected with the patterned electrodes; and the lead terminals are electrically connected to the patterned electrodes.

In a fifth aspect of the present invention, there is provided a piezoelectric oscillator comprising a piezoelectric ceramic element, upper and lower substrates sandwiching the piezoelectric ceramic element, and external electrodes, wherein the piezoelectric ceramic element comprises the piezoelectric ceramic and internal electrodes formed on main surfaces thereof, and the external electrodes are electrically connected to the internal electrodes and formed on sides faces of the piezoelectric ceramic element and side faces of the upper and lower substrates.

By employment of such a constitution, there is provided a piezoelectric oscillator in which the response of an unnecessary fifth order vibration is suppressed.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with accompanying drawings, in which.

DESCRIPTION OF PREFERRED EMBODIMENTS

The piezoelectric ceramic according to the present invention comprises lead titanate as a primary component and a titanium oxide crystalline phase.

The piezoelectric ceramic may further contain a variety of secondary components such as $La_2O_3$ and $MnO$ in accordance with need.

The titanium oxide crystalline phase of the present invention refers to a secondary phase comprising titanium oxide, and the form thereof is not particularly limited.

The titanium oxide crystalline phase may be generated by segregating titanium oxide in lead titanate during firing or by separately adding a titanium oxide powder to lead titanate, followed by crystallization.

The firing temperature of the piezoelectric ceramic according to the present invention must be a temperature at which a titanium oxide crystalline phase is formed. The higher the firing temperature, the greater the ratio of the titanium oxide crystalline phase to the primary component and the greater the grain size of the titanium oxide crystalline phase.

EXAMPLES

Figure 1:
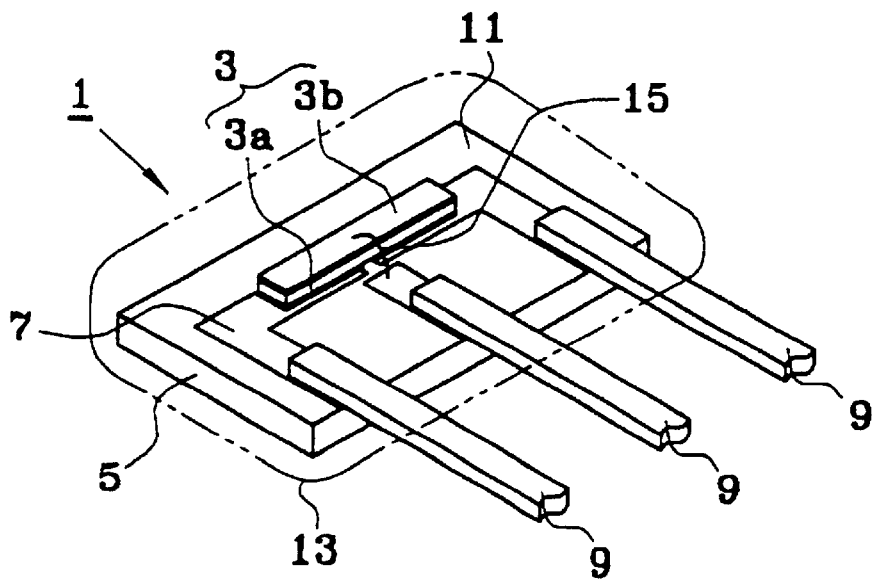
FIG. 1 is a schematic perspective view of a piezoelectric oscillator according to the present invention.

The methods for producing piezoelectric ceramic and piezoelectric oscillator will next be described in detail by way of examples and with reference to FIGS. 1 to 3. FIG. 1 is a schematic perspective view of a piezoelectric oscillator according to the present invention. The chained double-dashed line in FIG. 1 represents the location of a protective cap and molding resin.

Example 1

Powders of PbO, $TiO_2$, $La_2O_3$, and $MnCO_3$ were provided as starting materials. The powders were weighed so as to attain predetermined proportions and wet-mixed by use of a ball mill to thereby obtain a mixture. The mixture was dehydrated, granulated, and calcined at 980° C. for 1 hour to thereby obtain a calcined product. The calcined product was crushed and a binder was added thereto to thereby obtain a binder-containing mixture. The binder-containing mixture was compression-molded into a flat plate under a pressure of 4 ton/cm² to thereby obtain a compact. The compact was fired at 1220–1260° C., so as to induce precipitation of a $TiO_2$ crystalline phase in the primary component to thereby obtain a piezoelectric ceramic. Electrodes were formed on the two main surfaces of the piezoelectric ceramic to thereby obtain a piezoelectric ceramic element.

The thus-obtained piezoelectric ceramic was mirror-polished and subjected to SEM photography so as to measure the average grain size of the $TiO_2$ crystalline phase in the primary component of the ceramic. Responses of third order vibration (3θmax) and fifth order vibration (5θmax) of the piezoelectric ceramic element were determined by use of an impedance gain phase analyzer. The results are shown in Table 1. A sample having no $TiO_2$ crystalline phase served as a comparative sample (Comparative Example). Samples in Table 1 marked with*fall outside certain limited scopes of the present invention.

TABLE 1

| Sample No. | Firing temperature (° C.) | Average grain size of the $TiO_2$ crystalline phase (µm) | 3 θ max (deg) | 5 θ max (deg) |
|---|---|---|---|---|
| *1 | 1220 | 3.0 | 82.6 | 54.1 |
| 2 | 1230 | 4.0 | 81.3 | 49.2 |
| 3 | 1235 | 4.5 | 80.5 | 41.8 |
| 4 | 1240 | 5.0 | 80.5 | 41.0 |
| 5 | 1245 | 28.0 | 78.7 | 32.3 |
| *6 | 1250 | 52.5 | 64.1 | −21.3 |
| *7 | 1260 | 100.0 | 59.7 | −25.4 |
| Comparative Example | 1180 | — | 81.6 | 54.5 |

As is apparent from Table 1, the fifth order vibration response (5θmax) of samples having a TiO2crystalline phase is suppressed as compared with samples having no $TiO_2$ crystalline phase.

The average grain size of a $TiO_2$ crystalline phase preferably falls within the range of about 4–28 µm. This is because when the average grain size is less than about 4 µm as in the case of Sample No. 1, effect of suppressing a fifth order vibration response (5θmax) is disadvantageously small, whereas in the case in which the average grain size of the $TiO_2$ crystalline phase is more than about 28 µm as in the case of Sample No. 6 or 7, the third order vibration response (3θmax) is also suppressed, which is disadvantageous.

The firing temperature of piezoelectric ceramic material is preferably about 1230–1245° C. This is because when the firing temperature is lower than about 1230° C. as in the case of Sample No. 1, the effect of suppressing a fifth order vibration response (5θmax) is disadvantageously small, whereas when firing the temperature is higher than about 1245° C. as in the case of Sample No. 6 or 7, the third order vibration response (3θmax) is also suppressed, which is disadvantageous.

Example 2

In a manner similar to that described in Example 1, a calcined $PbTiO_3$ product was produced. The calcined $PbTiO_3$ was crushed and $TiO_2$ powder was added thereto and mixed therewith. A binder was added to and mixed with the resultant crushed product to thereby obtain a binder-containing mixture. The binder-containing mixture was compression-molded into a flat plate under a pressure of 4 ton/cm² so as to obtain a compact. The compact was fired at 1180° C. to thereby obtain the piezoelectric ceramic of the present invention. Electrodes were formed on the two main surfaces of the piezoelectric ceramic to thereby obtain a piezoelectric ceramic element.

The resultant piezoelectric ceramic was subjected to measurement as described in Example 1 to thereby confirm that the $TiO_2$ crystalline phase was present in $PbTiO_3$ serving as the primary component of the piezoelectric ceramic and that the fifth order vibration response (5θmax) of the piezoelectric ceramic was suppressed.

Example 3

A resin-molding-type piezoelectric oscillator will next be described. However, the piezoelectric oscillator of the present invention is not limited only to this type of resonator.

As illustrated in FIG. 1, electrodes 3b were formed on the two main surfaces of a piezoelectric ceramic 3a obtained from Example 1 or 2 to thereby obtain a piezoelectric ceramic element 3. Subsequently, an insulating substrate 5 printed with three patterned electrodes 7 was provided, and the piezoelectric ceramic element 3 was mounted on the insulating substrate 5 by use of a conductive adhesive (not illustrated) such that the electrodes on the lower side of the piezoelectric ceramic element 3 were connected directly to two of the patterned electrodes 7. The electrode on the upper side of the piezoelectric ceramic element 3 was connected to the remaining patterned electrode 7 by use of a wire 15. Lead terminals 9 were soldered onto the patterned electrodes 7, and thereafter, the entirety of the insulating substrate was covered with an outer resin by way of molding to thereby obtain a piezoelectric oscillator 1. A vibration region of the piezoelectric ceramic 3a was formed in such a manner that a wax was applied to the corresponding portion in advance followed by evaporation during curing of the outer resin 13 to thereby obtain a cavity.

Example 4

A surface mounted type piezoelectric oscillator will next be described. However, the piezoelectric oscillator of the present invention is not limited only to this type of resonator.

Figure 2:
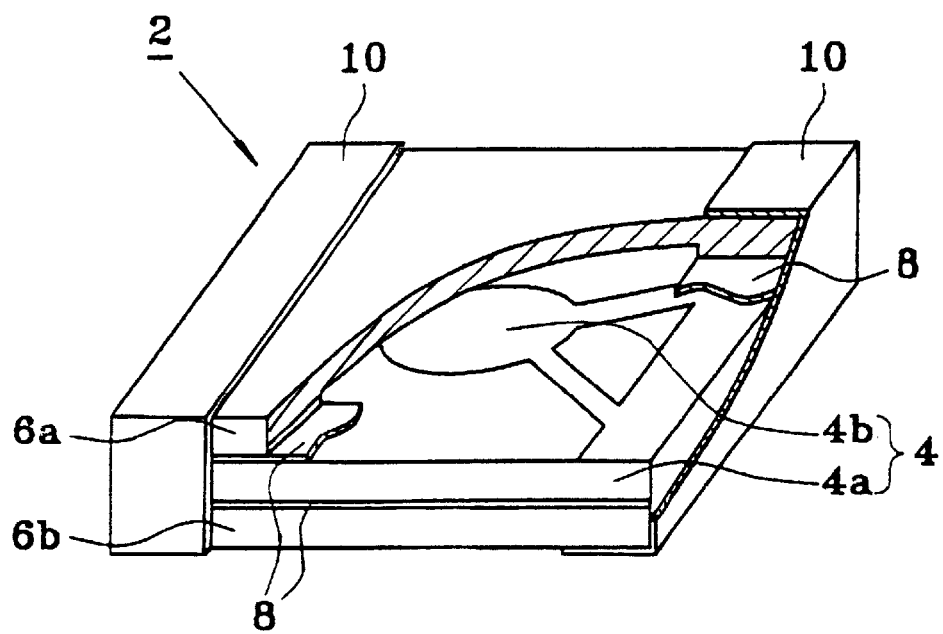
FIG. 2 is a perspective view of a partially cut-away piezoelectric oscillator according to one embodiment of the present invention.

As illustrated in FIG. 2, internal electrodes 4b were formed on the main surfaces of a piezoelectric ceramic 4a obtained from Example 1 or 2, to thereby obtain a piezoelectric ceramic element 4. Subsequently, upper and lower substrates 6a and 6b formed of an insulation material were respectively fixed to the upper and lower main surfaces of the piezoelectric ceramic element 4 by use of epoxy-based adhesive 8 for holding the piezoelectric ceramic element 4 therebetween. External electrodes 10 were formed on outer surfaces of the piezoelectric ceramic element 4 to which internal electrodes 4b extended to thereby obtain a piezoelectric oscillator 2.

Figure 3:
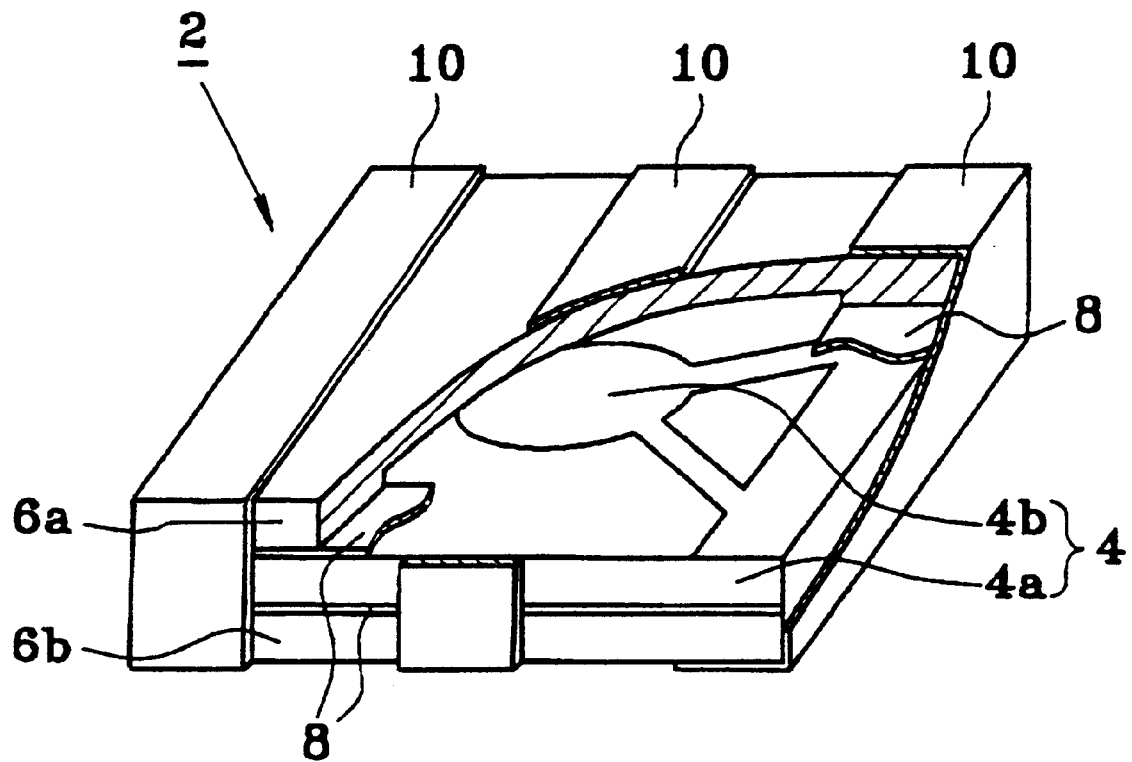
FIG. 3 is a perspective view of a partially cut-away piezoelectric oscillator according to another embodiment of the present invention.

As illustrated in FIG. 3, when the upper substrate is formed of a dielectric substrate and an external electrode 10 is additionally provided at the center of the upper surface of the piezoelectric oscillator 2, there can be obtained a piezoelectric oscillator 2 having the function of a capacitor. In order to serve as a vibration region, each of the upper and lower substrates 6a and 6b is provided with a concave portion for forming a cavity.

What is claimed is:

1. A piezoelectric ceramic comprising a lead titanate phase containing dispersed therein a titanium oxide crystalline phase, wherein the average grain size of the titanium oxide crystalline phase is about 4–28 µm.

2. The piezoelectric ceramic according to claim 1 having a pair of electrodes on main surfaces thereof.

3. A piezoelectric oscillator comprising an insulating substrate, a piezoelectric ceramic element, lead terminals and a resin covering for the piezoelectric ceramic element, wherein the insulating substrate has patterned electrodes thereon;

the piezoelectric ceramic element comprises the piezoelectric ceramic according to claim 2 and the electrodes on the surface of the ceramic are electrically connected to the patterned electrodes; and the lead terminals are electrically connected to the patterned electrodes.

4. A piezoelectric oscillator comprising a piezoelectric ceramic element, upper and lower substrates sandwiching the piezoelectric ceramic element and external electrodes, wherein the piezoelectric ceramic element comprises a piezoelectric ceramic according to claim 2 having electrodes formed on two main surfaces of the ceramic, and the external electrodes are on sides surfaces of the piezoelectric ceramic element and side surfaces of the upper and lower substrates and are electrically connected to the electrodes on the main surfaces of the ceramic.

* * * * *